United States Patent
Iadanza

(10) Patent No.: US 11,764,764 B1
(45) Date of Patent: Sep. 19, 2023

(54) LATCH DEVICE AND OPERATION METHOD THEREOF

(71) Applicant: NANYA TECHNOLOGY CORPORATION, New Taipei (TW)

(72) Inventor: Joseph Iadanza, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/943,225

(22) Filed: Sep. 13, 2022

(51) Int. Cl.
*H03K 3/356* (2006.01)
*G11C 11/412* (2006.01)
*H03K 3/037* (2006.01)

(52) U.S. Cl.
CPC ............ *H03K 3/037* (2013.01); *G11C 11/412* (2013.01); *H03K 3/356104* (2013.01)

(58) Field of Classification Search
CPC .............. G11C 11/412; G11C 11/4125; H03K 3/356086; H03K 3/356104; H03K 3/356182
See application file for complete search history.

(56) References Cited

U.S. PATENT DOCUMENTS

| | | | | |
|---|---|---|---|---|
| 4,864,544 A * | 9/1989 | Spak | ....................... | G06F 7/78 365/189.12 |
| 5,903,169 A * | 5/1999 | Kong | ................... | H03K 19/215 326/121 |
| 7,605,614 B2 * | 10/2009 | Huang | ................. | H03K 19/086 326/115 |
| 11,601,118 B1 * | 3/2023 | Iadanza | ................ | H03K 3/0375 |
| 2011/0128796 A1 * | 6/2011 | Chuang | ................. | G11C 11/412 365/191 |

\* cited by examiner

*Primary Examiner* — Patrick O Neill
(74) *Attorney, Agent, or Firm* — JCIPRNET

(57) ABSTRACT

A latch device includes a memory cell, a pair of write switches and an output terminal. The memory cell stores a latch data, and the pair of write switches is coupled to the memory cell through a first node and a second node. The pair of write switches holds the latch data stored in the memory cell when logic values of a first input signal and a second input signal are a predetermined logic value, and updates the latch data stored in the memory cell when the logic values of the first input signal and the second input signal are mutually exclusive logic values. The output terminal is coupled to at least one of the first node and the second node and outputs an output signal based on the latch data stored in the memory cell. An operation of the latch memory is also introduced.

20 Claims, 9 Drawing Sheets

220

LATCH DEVICE AND OPERATION METHOD THEREOF

BACKGROUND

Technical Field

The disclosure generally relates to a latch device, and more particularly to an operation method and a latch device and that are capable of improving the speed of the latch device.

Description of Related Art

Differential cascode voltage switch (DCVS) latches are commonly used in many systems due to their high speed, low power and noise immunity. The DCVS latch operates in a reset mode during one half of the clock cycle and senses or amplifies the voltage differential on the latch input pair on the clock edge (i.e., rising or falling edges). Because the DCVS latch does not retain the sensed amplified logic value throughout the clock cycle, the DCVS latch is paired with a keeper latch which acts as a transparent element when the DCVS latch is in its sense or amplify mode and retains the logic value when the DCVS latch is in its reset mode. Because the keeper latch transfers data directly from the DCVS latch without a clock, the speed of the keeper latch is critical to achieving high operational frequency in systems.

A creative design of a latch device (i.e., keeper latch) that may improve speed and reduce the physical area of the latch device in the integrated circuit (IC) is desired.

SUMMARY

The disclosure introduces a latch device and an operation method that may improve the speed of the latch device.

In some embodiments, the latch device includes a memory cell, a pair of write switches and an output terminal. The memory cell includes a pair of cross-coupled inverters that store a latch data, and a pair of write switches is coupled to the memory cell through a first node and a second node. The pair of write switches is configured to receive a first input signal and a second input signal, hold the latch data stored in the memory cell when logic values of the first input signal and the second input signal are a predetermined logic value, and update the latch data stored in the memory cell when the logic values of the first input signal and the second input signal are mutually exclusive logic values. The output terminal is coupled to at least one of the first node and the second node and is configured to output an output signal based on the latch data stored in the memory cell.

In some embodiments, the latch device includes a memory cell, a pair of write switches, a pair of inverters, a pair of switches and an output terminal. The memory cell includes a pair of cross-coupled inverters that store a latch data, and a pair of write switches is coupled to the memory cell through a first node and a second node. The pair of write switches is configured to receive a first input signal and a second input signal, hold the latch data stored in the memory cell when logic values of the first input signal and the second input signal are a predetermined logic value, and update the latch data stored in the memory cell when the logic values of the first input signal and the second input signal are mutually exclusive logic values. The pair of inverters is configured to invert the first input signal and the second input signal to generate a first inverted input signal and a second inverted input signal, respectively. The first switch of the pair of switches is coupled to the first node and is configured to drive the first node to the reference voltage (i.e., second reference voltage) when the second inverted input signal is asserted to the first switch. The second switch of the pair of switches is coupled to the second node and is configured to drive the second node to the second reference voltage when the first inverted input signal is asserted to the second switch. The output terminal is coupled to at least one of the first node and the second node and is configured to output an output signal based on the latch data stored in the memory cell.

In some embodiments, the operation method is adapted to a latch device that includes a memory, a pair of write switches being coupled to the memory through a first node and a second node. The operation method includes steps of receiving a first input signal and a second input signal; holding a latch data stored in the memory cell in response to determining that logic values of the first input signal and the second input signal are a predetermined logic value; updating the latch data stored in the memory cell in response to determining that the logic values of the first input signal and the second input signal are mutually exclusive logic values; and outputting an output signal based on the latch data stored in the memory cell.

In some embodiments, a latch device includes a pair of write switches that are configured to hold a latch data stored in a memory of the latch device or to update the latch data stored in the memory based on logic values of the first and second input signals. The latch device may hold the latch data stored in the memory when the logic values of the first and second input signals are a predetermined logic value; and the latch device may update the latch data stored in the memory when the logic values of the first and second input signals are mutually exclusive logic values. Since the pair of write switches may quickly set the latch data of the memory cell to a desired value, the speed of the latch device is improved and the latency of the latch device is reduced. In addition, since the number of electronic components of the latch device are relatively small, the latch device has a small physical area in the integrated circuit (IC).

DESCRIPTION OF THE EMBODIMENTS

Figure 1:
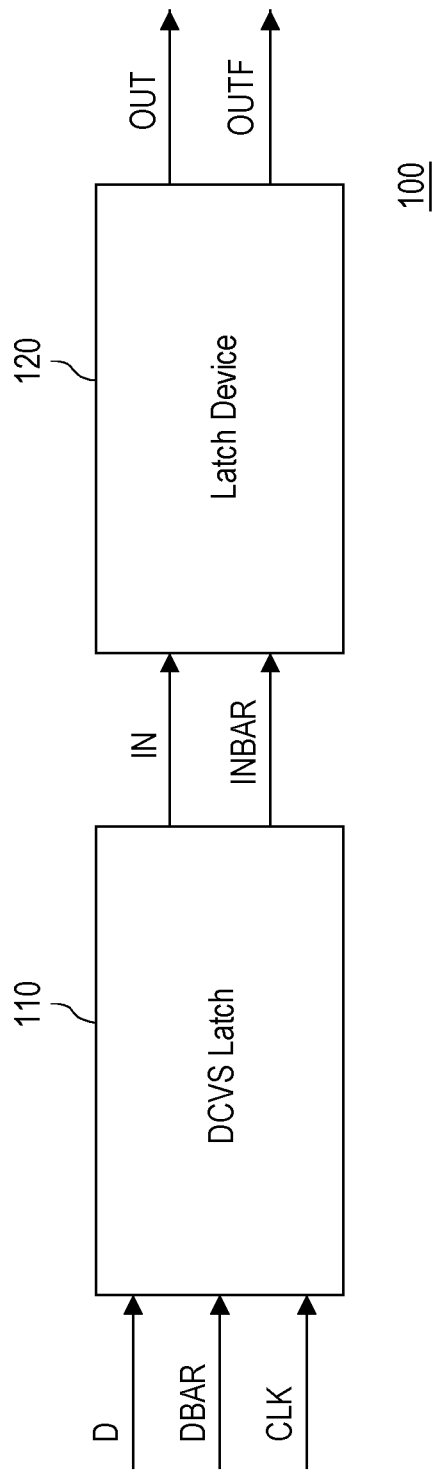
FIG. 1 illustrates a schematic diagram of system including a differential cascode voltage switch (DCVS) latch and a latch device in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a system 100 that includes a differential cascode voltage switch (DCVS) latch 110 and a latch device 120 in accordance with some embodiments. The DCVS latch 110 may receive a clock signal CLK and data signals D and DBAR, perform a latching operation based on the received clock signal CLK and the data signals D and DBAR, and output signals IN and INBAR to latch device 120. The DCVS latch 110 may operate in a reset mode, in which the logic value of both the signals IN and INBAR are set to a predetermined logic value, or in a transparent mode in which the signals IN and INBAR are set according to logic values of signals D and DBAR. For example, in the reset mode of the DCVS latch 110, the logic values of the signals IN and INBAR are set to "11" or "00". In the transparent mode of the DCVS latch 110, the logic values of signals IN and INBAR may be determined according to a difference between the signals D and DBAR. For example, when the value of the signal D is greater than the value of the signal DBAR, the signal IN is set to a first logic value (i.e., logic value of "1") and the signal INBAR is set to the second logic value (i.e., logic value of "0"); and when the value of the signal D is less than the value of the signal DBAR, the signal IN is set to the second logic value and the signal INBAR is set to the first logic value. The DCVS 110 may operate in the transparent mode when the clock signal CLK is at a logic value of "1"; and the DCVS 110 may operate in the reset mode when the clock signal CLK is at a logic value of "0". It is appreciated that the first logic value, the second logic value, the predetermined logic value and/or the CLK reset/transparent mode logic values could be set differently according to design requirements.

The latch device 120 (also referred to as a keeper latch) may include input terminals and output terminals, in which the input terminals of the latch device 120 are coupled to the DCVS latch 110 to receive the signals IN and INBAR (also referred to as input signals IN and INBAR), and output signals OUT and OUTF are connected to the output terminals of the latch device 120. In some embodiments, the latch device 120 is configured to hold a latch data stored in the latch device 120 when the logic values of the input signals IN and INBAR are the same predetermined logic value. For example, when the logic values of the input signals IN and INBAR are "11", the latch device 120 holds the latch data stored in the latch device 120. However, the disclosure does not intend to limit the predetermined logic value to "11", the predetermined logic value may be "00" in some alternative embodiments. In some embodiments, the latch device 120 is configured to update the latch data stored in the latch device 120 when the logic values of the input signals IN and INBAR are mutually exclusive logic values. For example, latch data stored in the latch device 120 is updated when the logic values of the input signals IN and INBAR are "10" or "01." The latch device 120 may drive the output signals OUT and OUTF based on the latch data stored in latch device 120.

Figure 2:
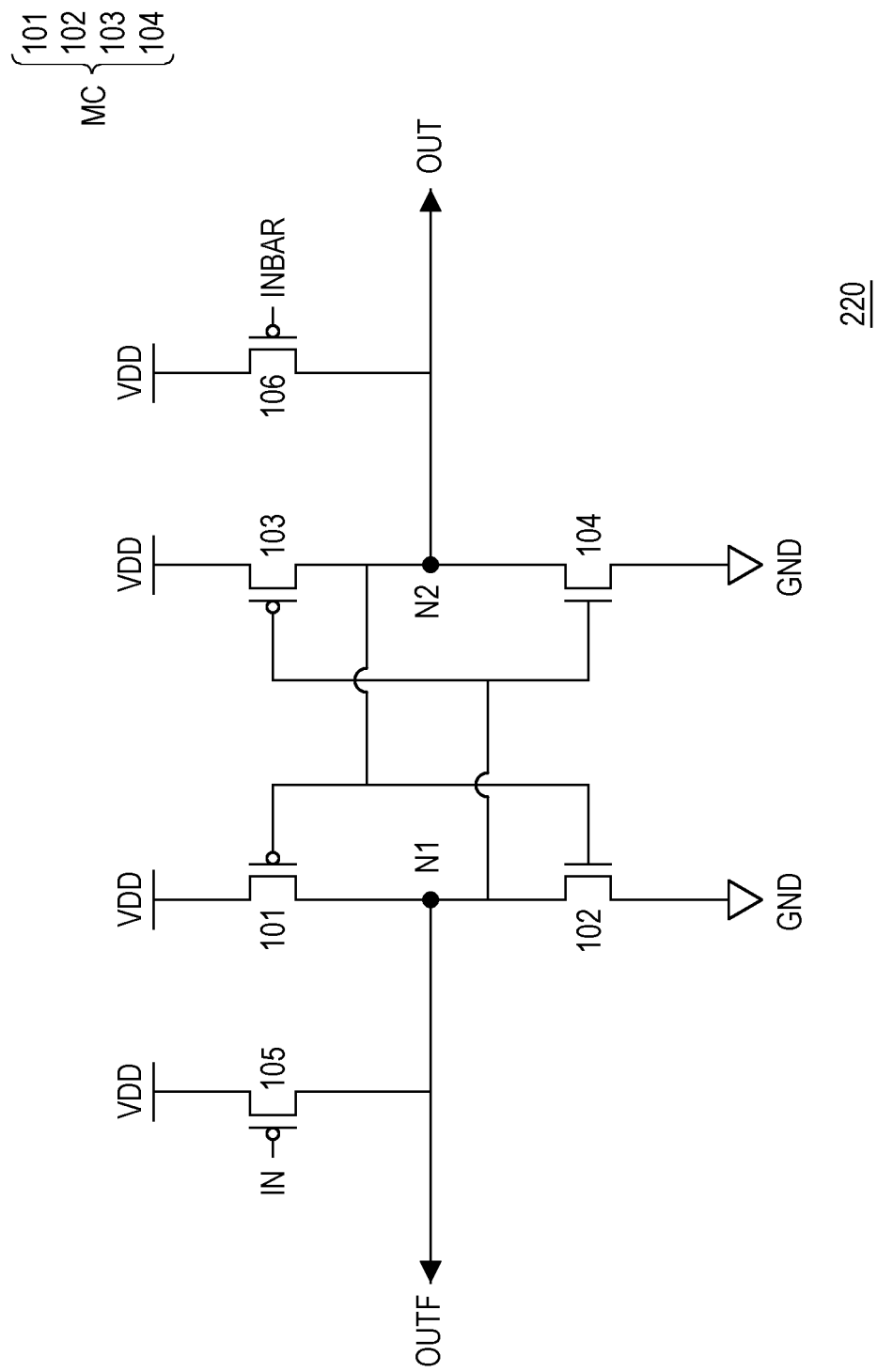
FIG. 2 through FIG. 8 illustrate schematic diagrams of latch devices in accordance with some embodiments.

FIG. 2 illustrates a schematic diagram of a latch device 220 in accordance with some embodiments. The latch device 220 in FIG. 2 may be the same as the latch device 120 in FIG. 1. The latch device 220 may include a memory cell MC, a pair of write switches 105, 106, a first node N1 and a second node N2. The memory cell MC includes a pair of cross-coupled inverters, in which one of the cross-coupled inverters includes transistors 101 and 102, and another one of the cross-coupled inverters includes transistors 103 and 104. Transistor 101 is coupled between a first reference node and the first node N1, transistor 102 is coupled between the first node N1 and a second reference node, and the control terminals (i.e., gate terminals) of transistors 101 and 102 are coupled to the second node N2. The first reference node refers to the node that receives a first reference voltage, VDD, and the second reference node refers to the node that receives a second reference voltage, GND. Transistor 103 is coupled between the first reference node and the second node N2; transistor 104 is coupled between the second node N2 and the second reference node, and the control terminals (i.e., gate terminals) of transistors 103 and 104 are coupled to the first node N1. In some embodiments, transistors 101 and 103 are p-type transistors and transistors 102 and 104 are n-type transistors, but the disclosure is not limited thereto.

The pair of write switches 105 and 106 is coupled to the memory cell MC through the first node N1 and the second node N2, and the pair of write switches 105 and 106 is configured to receive first and second input signals IN and INBAR. The first write switch 105 is coupled between the first reference node and the first node N1, and a control terminal of the first write switch 105 receives the first input signal IN. The second write switch 106 is coupled between the first reference node and the second node N2, and a control terminal of the second write switch 106 receives the second input signal INBAR. In some embodiments, each of the first and second write switches 105 and 106 is a transistor, but the disclosure is not limited thereto. Any circuit structure that has a switching function falls within the scope of the disclosure.

In some embodiments, the memory cell MC is configured to store the latch data of latch device 220, and latch device 220 operates according to logic values of the input signals IN and INBAR. The latch device 220 may hold the latch data stored in the memory cell MC when the logic values of the input signals IN and INBAR are predetermined logic values (i.e., logic values of "11"). For an example, when the logic values of the input signals IN and INBAR are "11", both of the write switches 105 and 106 are switched off, and the latch data stored in the memory MC is held. It is appreciated that the predetermined logic value may be set to "00" instead of "11", and the circuit structure of the latch device 220 may be changed to meet the design requirements.

The latch device 220 may update the latch data stored in the memory cell MC by writing an updated value to the memory cell MC when the logic values of the input signals IN and INBAR are mutually exclusive logic values (i.e., logic values of "10" or "01"). For example, when the logic values of the input signals IN and INBAR are "0" and "1", respectively, the first write switch 105 is switched on and the second write switch 106 is switched off. As a result, the first node N1 is pulled up to the first reference voltage VDD, and transistor 104 of the cross-coupled inverter is switched on to pull down the second node N2 to the second reference voltage GND. In this way, the latch data stored in the memory cell MC is updated to a new logic value (i.e., logic value of "1" at the first node N1). Similarly, when the logic values of the input signals IN and INBAR are "1" and "0", respectively, the first write switch 105 is switched off and the second write switch 106 is switched on. As a result, the second node N2 is pulled up to the first reference voltage VDD, and transistor 102 of the cross-coupled inverter is switched on to pull down the first node N1 to the second reference voltage GND. In this way, the latch data stored in the memory cell MC is updated to a new logic value (i.e., logic value of "0" at the first node N1).

In some embodiments, transistors 102 and 104 and the first and second write switches 105, 106 are optimized to have high switching speed (or low switching latency), and other transistors (i.e., transistors 101 and 103) are optimized for low capacitance or low leakage. For example, the switching speed of transistors 102, 104 and the first and second write switches 105 and 106 is faster than the switching speed of transistors 101 and 103. In this way, the latching speed of the latch device 220 is improved, and the latching latency of the latch device 220 is reduced. In addition, since the number of the electronic components included in the latch 220 is relatively small, the physical area in an integrated circuit is small.

Figure 3:
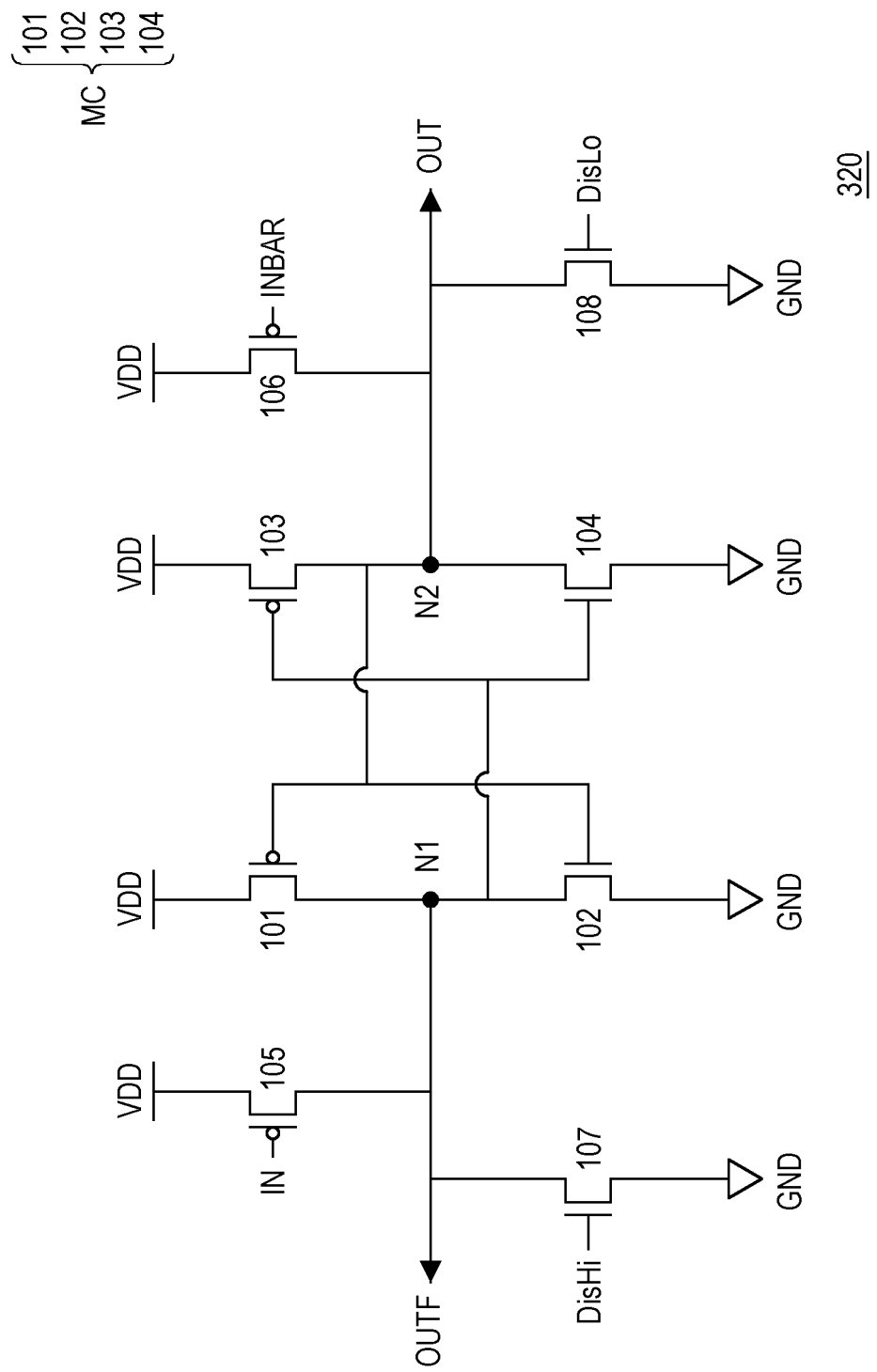

FIG. 3 illustrates a schematic diagram of a latch device 320 in accordance with some embodiments. The same elements of latch device 320 in FIG. 3 and latch device 220 in FIG. 2 are illustrated using the same reference numbers. Referring to FIG. 2 and FIG. 3, a difference between latch device 320 in FIG. 3 and latch device 220 in FIG. 2 is that the latch device 320 further includes first and second set switches 107 and 108. The first set switch 107 is coupled between the first node N1 and the second reference node (i.e., the reference node that receives the reference voltage GND), and a control terminal of the first set switch 107 receives a first control signal DisHi. The second set switch 108 is coupled between the second node N2 and the second reference node, and a control terminal of the second set switch 108 receives a second control signal DisLo. The first and second set switches 107 and 108 allow the latch device 320 to set the logic values to the first and second nodes N1 and N2 even when the logic values of both input signals IN and INBAR are at the predetermined logic values (i.e., logic values of "11"). In some embodiments, the first control signal DisHi or the second control signal DisLo may only be at a logic value of "1" when the logic values of both input signals IN and INBAR are at the predetermined logic values (i.e., logic values of "11"). In other words, when the input signals IN and INBAR are not in the predetermined logic values, both the first and second control signals DisHi and DisLo are set to the logic value of "0".

In some embodiments, when the logic values of the input signals IN and INBAR are "11" and the logic values of the first and second control signals DisHi and DisLo are "10", the first set switch 107 is switched on and the second set switch 108 is switched off. As a result, the first node N1 is pulled down by the first set switch 107 to have a logic value of "0", and the second node N2 is pulled up by the transistor 103 to have a logic value of "1." When the logic values of the input signals IN and INBAR are "11" and the logic values of the first and second control signals DisHi and DisLo are "01", the first set switch 107 is switched off and the second set switch 108 is switched on. As a result, the second node N2 is pulled down by the second set switch 108 to have a logic value of "0", and the first node N1 is pulled up by the transistor 101 to have a logic value of "1." In this way, the latch device 320 may set the logic values for the first and second node N1 and N2 even if both the input signals IN and INBAR are in the predetermined logic value of "11".

Figure 4:
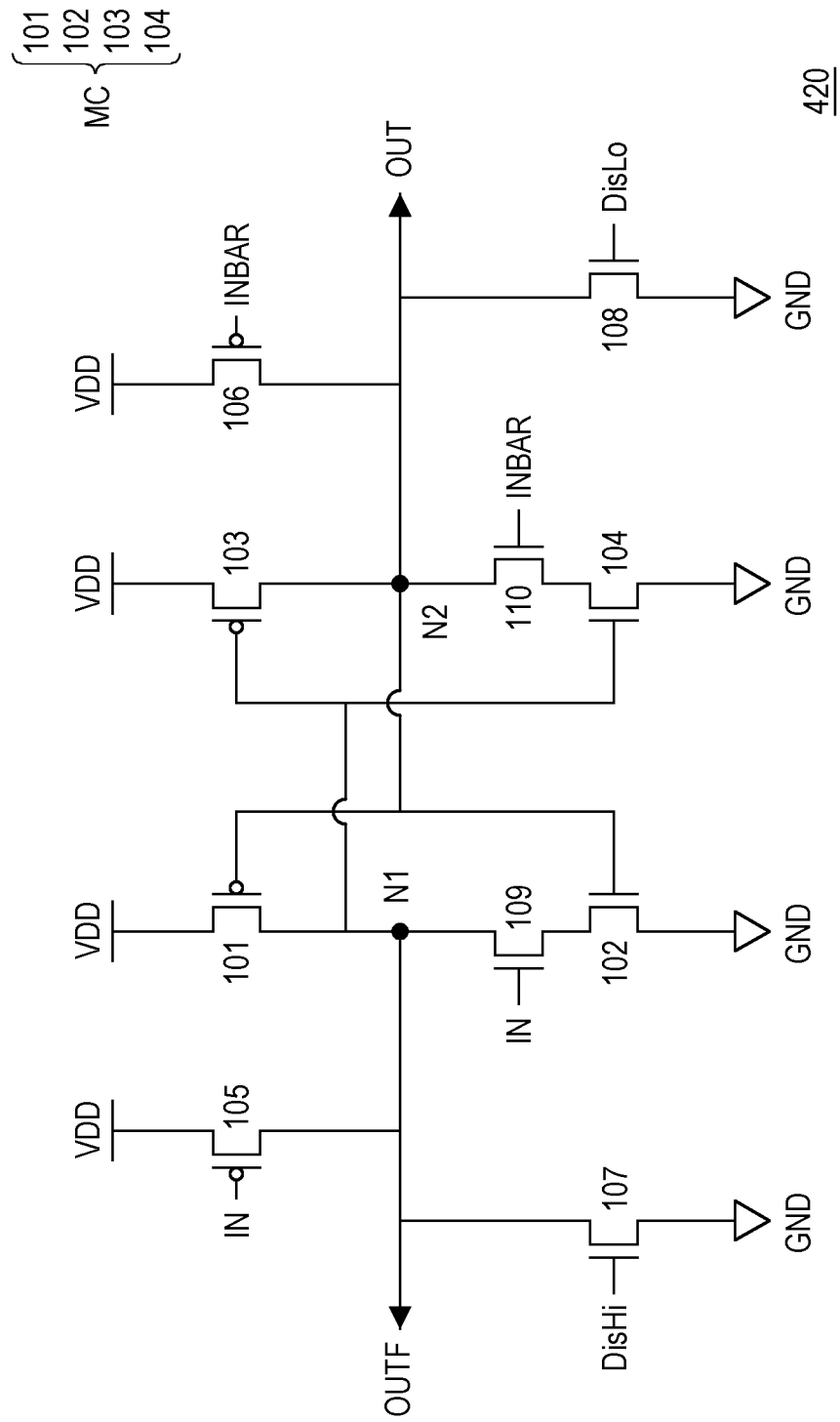

FIG. 4 illustrates a schematic diagram of a latch device 420 in accordance with some embodiments. The same elements of latch device 420 in FIG. 4 and latch device 320 in FIG. 3 are illustrated using the same reference numbers. Referring to FIG. 3 and FIG. 4, a difference between latch device 420 in FIG. 4 and latch device 320 in FIG. 3 is that latch device 420 further includes transistors 109 and 110, in which transistor 109 is coupled between transistors 101 and 102, and transistor 110 is coupled between transistors 103 and 104. A first terminal of transistor 109 is coupled to transistor 101 through the first node N1, a second terminal of transistor 109 is coupled to transistor 102, and a control terminal of transistor 109 receives the first input signal IN. A first terminal of transistor 110 is coupled to transistor 103 through the second node N2, a second terminal of transistor 110 is coupled to transistor 104, and a control terminal of transistor 110 receives the second input signal INBAR.

In some embodiments, when the first input signal IN is at a logic value of "0" and the second input signal INBAR is at a logic value of "1", the first write switch 105 and transistor 110 are switched on, and the second write switch 106 and transistor 109 are switched off. Since the first write switch 105 and transistor 110 are switched on and the second write switch 106 is switched off, the first node N1 is pulled up to a logic value of "1" and the second node N2 is pulled down to a logic value of "0". Meanwhile, since transistor 109 is switched off, an electrical path between the first node N1 and transistor 102 is cut off, thus preventing pulldown contention from transistor 102. The pulldown contention from transistor 102 is one of the limiting factors that slows down the switching speeds of transistors 103, 104 and 110, and the speed of the latch device 420. Since the pulldown contention from transistor 102 is prevented by switching off transistor 109, the switching speeds of transistors 103, 104, 110, and the speed of the latch device 420 are improved.

When the first input signal IN is at a logic value of "1" and the second input signal INBAR is at a logic value of "0", the first write switch 105 and transistor 110 are switched off, and the second write switch 106 and transistor 109 are switched on. Since the second write switch 106 and transistor 109 are switched on and the first write switch 105 is switched off, second node N2 is pulled up to a logic value of "1" and the first node N1 is pulled down to a logic value of "0". Meanwhile, since transistor 110 is switched off, an electrical path between the second node N2 and transistor 104 is cut off, thus preventing pulldown contention from transistor 104. Since the pulldown contention from transistor 104 is prevented by switching off transistor 110, the switching speeds of transistors 101, 102, 109, and the speed of the latch device 420 are improved.

Figure 5:
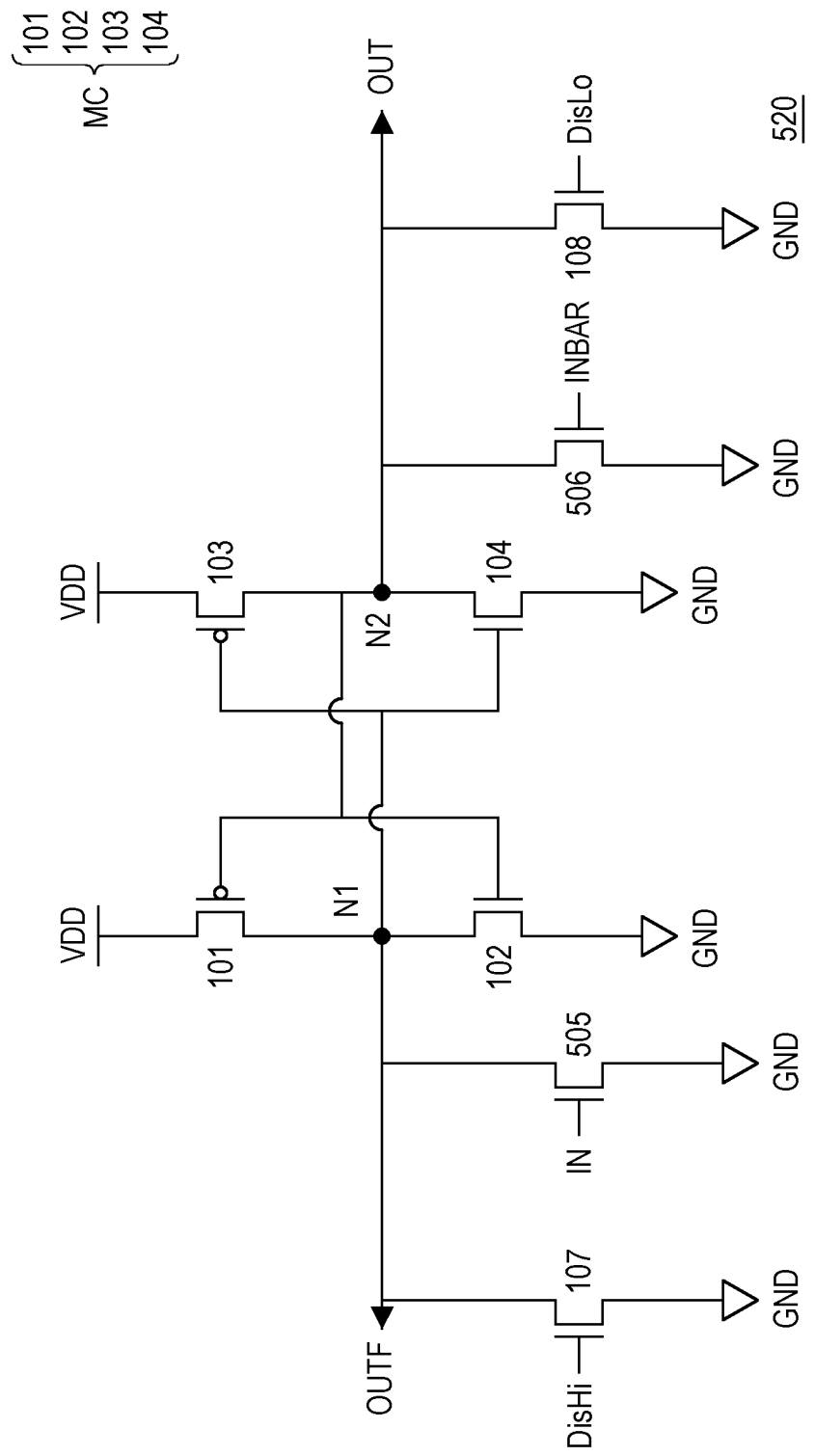

FIG. 5 illustrates a schematic diagram of a latch device 520 in accordance with some embodiments. The same elements of latch device 520 in FIG. 5 and latch device 320 in FIG. 3 are illustrated using the same reference numbers. Referring to FIG. 3 and FIG. 5, a difference between latch device 520 in FIG. 5 and latch device 320 in FIG. 3 is that latch device 520 includes write switches 505 and 506 instead of write switches 105 and 106. Write switch 505 is coupled between the first node N1 and the second reference node (i.e., the reference node that receives the reference voltage GND), and a control terminal of write switch 505 receives the first input signal IN. Write switch 506 is coupled between the second node N2 and the second reference node (i.e., the reference node that receives the reference voltage GND), and a control terminal of write switch 506 receives the second input signal INBAR. In some embodiments, when the logic values of the first and second input signals IN and INBAR are a predetermined logic value (i.e., logic value of "00"), write switches 505 and 506 are switched off, and the latch data stored in the memory cell MC is held. When the first input signal IN has a logic value of "1" and the second input signal INBAR has a logic value of "0", write switch 505 is switched on and write switch 506 is switched off. Accordingly, the first node N1 is pulled down to a logic value of "0" by write switch 505, and the second node N2 is pulled up to a logic value of "1" by transistor 103. When the first input signal IN has a logic value of "0" and the second input signal INBAR has a logic value of "1", write switch 505 is switched off and the write switch 506 is switched on. Accordingly, the second node N2 is pulled down to a logic value of "0" by the write switch 506, and the first node N1 is pulled up to a logic value of "1" by the transistor 101. In this way, latch device 520 may hold the latch data stored in the memory MC when the logic values of the input signals IN and INBAR are "00"; and latch device 520 may update the latch data stored in the memory MC when the logic values of the input signals IN and INBAR are mutually exclusive logic values (i.e., logic values of "01" or "10"). In some embodiments, transistors 101 and 103 in the memory cell MC and transistors included in the write switches 505, 506 are optimized to have high switching speed (or low switching latency), and other transistors (i.e., transistors 102 and 104) are optimized for low capacitance or low leakage. In this way, the latching speed of latch device 520 is improved, and the latching latency of latch device 520 is reduced.

Figure 6:
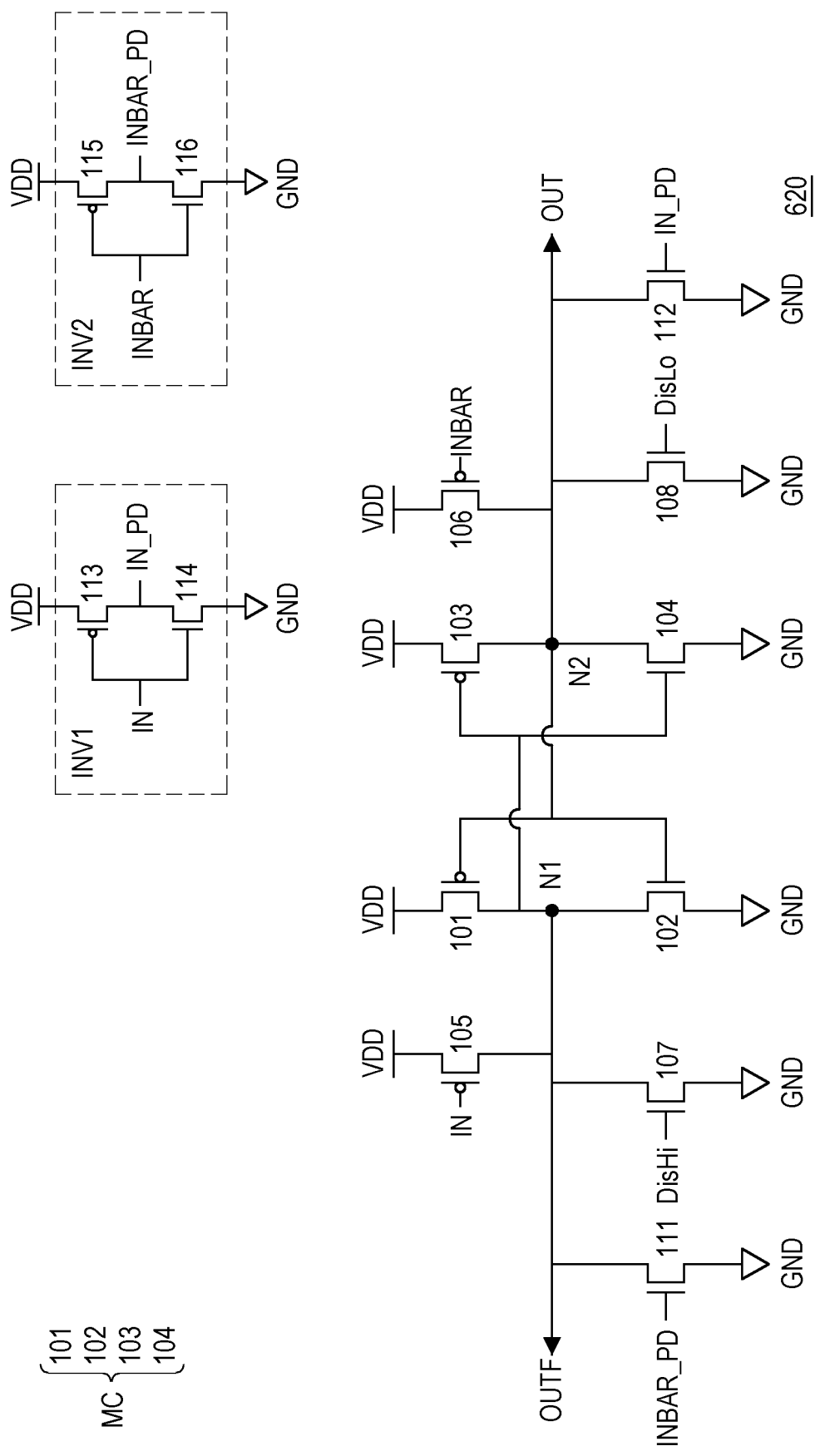

FIG. 6 illustrates a schematic diagram of a latch device 620 in accordance with some embodiments. The same elements of latch device 620 in FIG. 6 and latch device 320 in FIG. 3 are illustrated using the same reference numbers. Referring to FIG. 3 and FIG. 6, a difference between latch device 620 in FIG. 6 and latch device 320 in FIG. 3 is that latch device 620 further includes first and second switches 111, 112 (also referred to as first and second pulldown switches 111 and 112), and inverters INV1, INV2. Inverter INV1 is configured to receive the first input signal IN and invert the first input signal IN to generate a first inverted input signal IN_PD. Inverter INV1 may include transistors 113 and 114 being coupled between the first reference node and the second reference node, and control terminals of transistors 113 and 114 receive the first input signal IN. When the logic value of the first input signal IN is "1", transistor 113 is switched off, transistor 114 is switched on, and the logic value of the first inverted input signal (IN_PD) is "0." When the logic value of the first input signal IN is "0", transistor 113 is switched on, transistor 114 is switched off, and the logic value of the first inverted input signal (IN_PD) is "1." Similarly, inverter INV2 is configured to receive the second input signal INBAR and invert the second input signal INBAR to generate a second inverted input signal INBAR_PD. Inverter INV2 may include transistors 115 and 116 being coupled between the first reference node and the second reference node, and control terminals of transistors 115 and 116 receive the second input signal INBAR. The logic value of the second inverted input signal INBAR_PD is "1" when the logic value of the second input signal INBAR is "0", and vice versa.

In some embodiments, the first switch 111 is coupled between the first node N1 and the second reference node (i.e., the reference node that receive the reference voltage GND), and a control terminal of the first switch 111 receives the second inverted input signal INBAR_PD. The second switch 112 is coupled between the second node N2 and the second reference node, and a control terminal of the second switch 112 receives the first inverted input signal IN_PD. The first switch 111 is configured to drive the first node N1 to the reference voltage GND according to the second inverted input signal INBAR_PD. The second switch 112 is configured to drive the second node N to the reference voltage GND according to the first inverted input signal IN_PD. When the first input signal IN is at a logic value "0" and the second input signal INBAR is at a logic value of "1", the first write switch 105 is switched on, and the first node N1 is pulled up to the logic value of "1". Meanwhile, the first inverted input signal IN_PD with a logic value of "1" is asserted to the second switch 112, thus quickly pulling down the second node N2 to a logic value of "0". When the first input signal IN is at a logic value "1" and the second input signal INBAR is at a logic value of "0", the second write switch 106 is switched on, and the second node N2 is pulled up to a logic value of "1". Meanwhile, the second inverted input signal INBAR_PD with a logic value of "1" is asserted to the first switch 111, thus quickly pulling down the first node N1 to a logic value of "0". In this way, the first node N1 and the second node N2 may quickly reach the desired logic value, and the switching latency of latch device 620 is further reduced. In addition, since the first and second switches 111 and 112 may quickly pull down the first and second nodes N1 and N2 respectively to the desired logic values, transistors 102 and 104 are no longer responsible for high-speed switching of latch device 420. Thus, in some embodiments, transistors 102 and 104 may be optimized for criteria other than high speed switching, such as low capacitance, low leakage, stable storage and/or small physical area.

Figure 7:
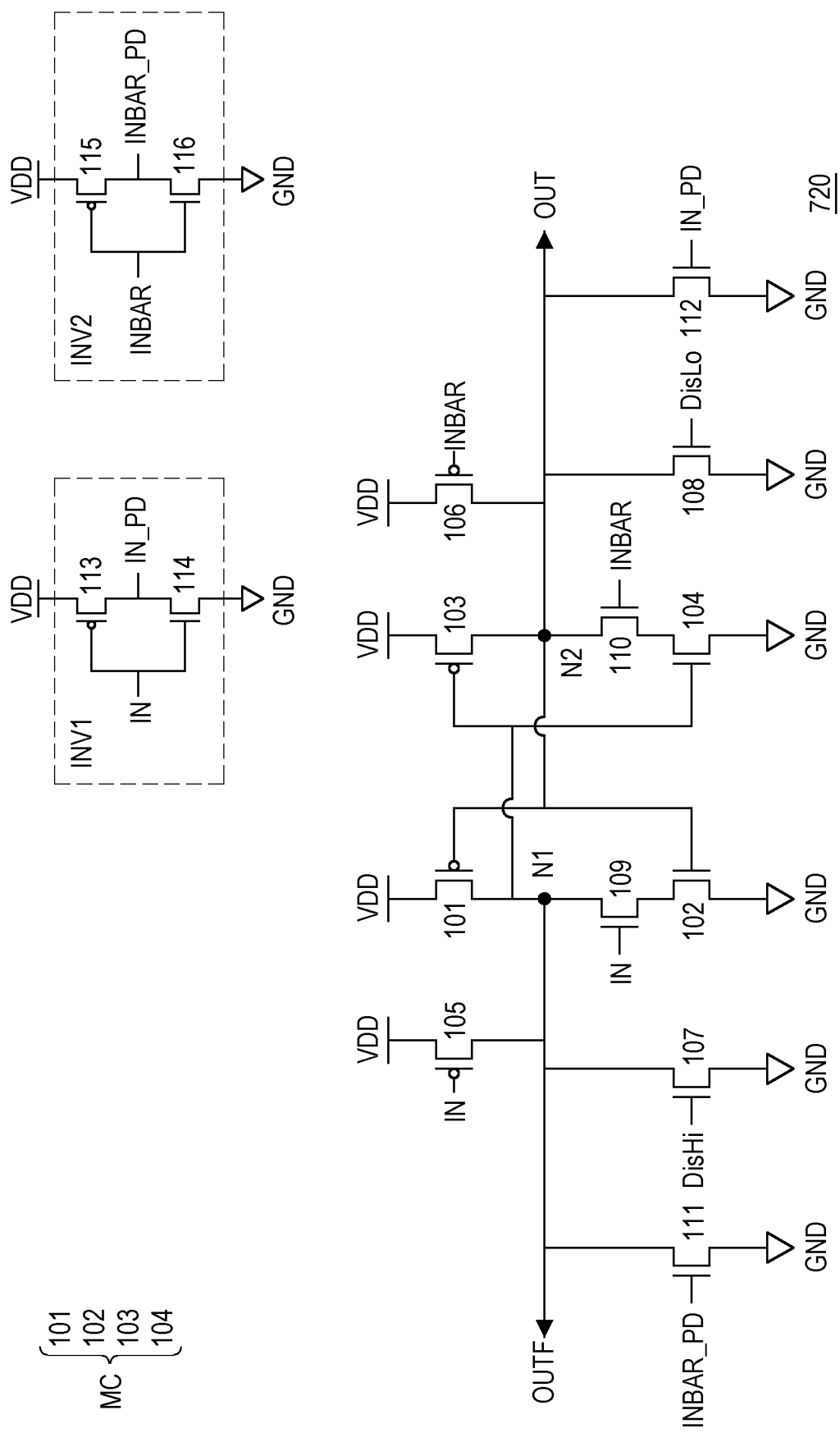

FIG. 7 illustrates a schematic diagram of a latch device 720 in accordance with some embodiments. The same elements of latch device 720 in FIG. 7 and latch device 620 in FIG. 6 are illustrated using the same reference numbers. Referring to FIG. 6 and FIG. 7, a difference between latch device 720 in FIG. 7 and latch device 620 in FIG. 6 is that latch device 720 further includes transistors 109 and 110, in which transistor 109 is coupled between transistors 101 and 102, and transistor 110 is coupled between transistors 103 and 104. Transistors 109 and 110 included in latch device 720 are the same as transistors 109 and 110 included in latch device 420 as shown in FIG. 4, thus detailed description about the operation of transistors 109 and 110 is omitted hereafter. Since transistors 109 and 110 are capable of preventing the pulldown contention from transistors 102 and 104, the speed of the latch device 720 is improved. In addition, since the first and second switches 111 and 112 may quickly pull down the first and second nodes N1 and N2 to desired logic values, the first node N1 and the second node N2 may quickly reach the desired logic value, and the switching latency of latch device 720 is further reduced.

Figure 8:
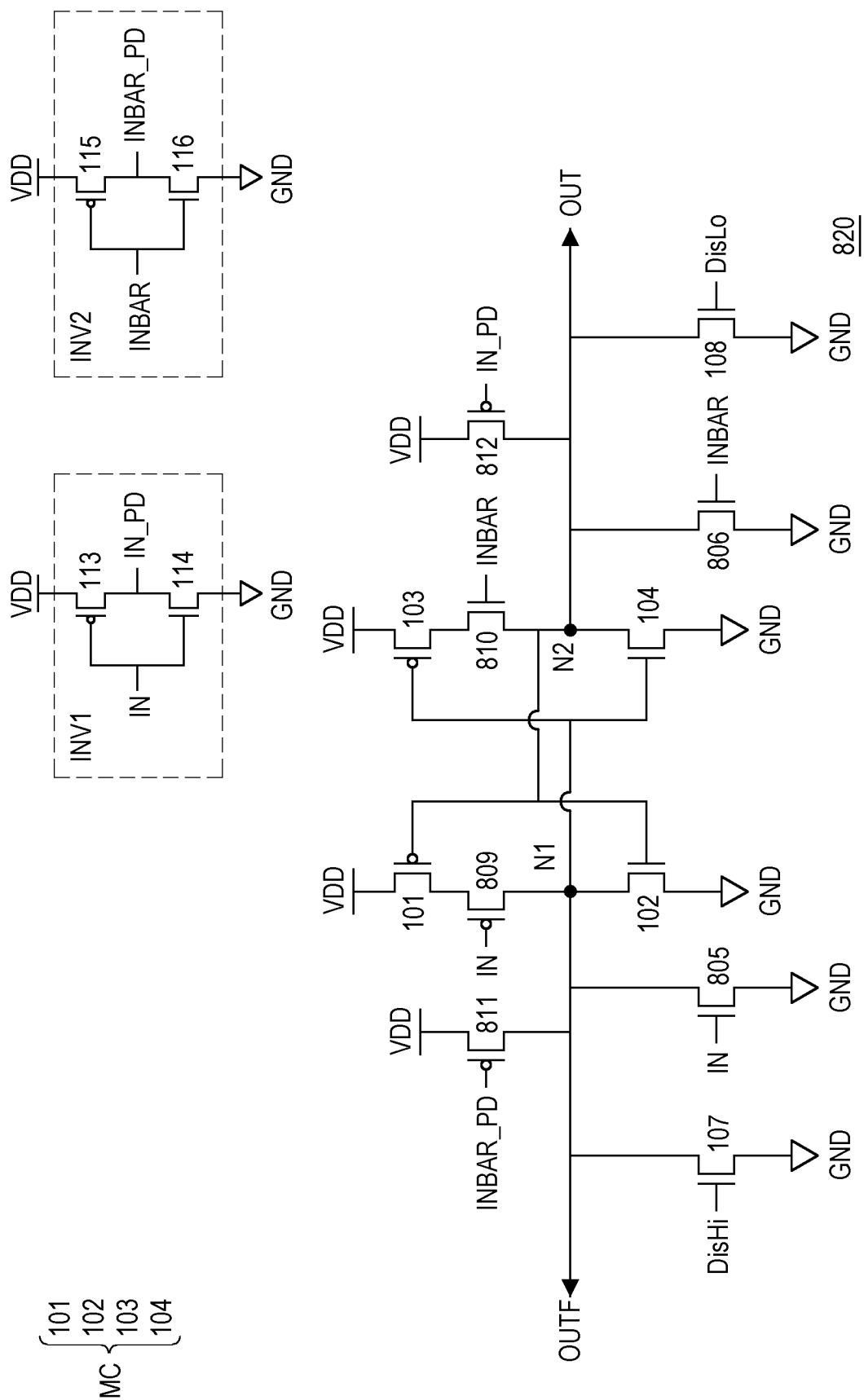

FIG. 8 illustrates a schematic diagram of a latch device 820 in accordance with some embodiments. The same elements of latch device 820 in FIG. 8 and latch device 720 in FIG. 7 are illustrated using the same reference numbers. Referring to FIG. 7 and FIG. 8, a difference between latch device 820 in FIG. 8 and latch device 720 in FIG. 7 is that latch device 820 includes write switches 805 and 806 instead of write switches 105 and 106. Write switch 805 is coupled between the first node N1 and the second reference node (i.e., the reference node that receives the reference voltage GND), and a control terminal of write switch 805 receives the first input signal IN. Write switch 806 is coupled between the second node N2 and the second reference node (i.e., the reference node that receives the reference voltage GND), and a control terminal of write switch 806 receives the second input signal INBAR. Another difference between latch device 720 in FIG. 7 and latch device 820 in FIG. 8 is that latch device 820 includes switches 811 and 812 (also referred to as pullup switches 811 and 812) instead of the switches 111 and 112. The switch 811 is coupled between the first node N1 and the first reference node (i.e., reference node that receives the reference voltage VDD), and the switch 812 is coupled between the second node N2 and the first reference node. The switches 811 and 812 are controlled by the second inverted input signal INBAR_PD and the first inverted input signal IN_PD, respectively. Another difference between latch device 720 in FIG. 7 and latch device 820 in FIG. 8 is that latch device 820 includes transistors 809 and 810 instead of transistors 109 and 110. A first terminal of transistor 809 is coupled to transistor 101, a second terminal of transistor 809 is coupled to transistor 102 through the first node N1, and a control terminal of transistor 809 receives the first input signal IN. A first terminal of transistor 810 is coupled to transistor 103, a second terminal of transistor 810 is coupled to transistor 104 through second node N2, and a control terminal of transistor 810 receives the second input signal INBAR.

In some embodiments, when the logic values of the first and second input signals IN and INBAR are a predetermined logic value (i.e., logic value "00"), the first and second write switches 805 and 806 are switched off, and latch device 820 holds the data stored in the memory cells MC. When the first input signal IN is at a logic value of "1" and the second input signal INBAR is at a logic value of "0", the first write switch 805 is switched on and the second write switch 806 is switched off. As a result, the first node N1 is pulled down to a logic value of "0" and the second node N2 is pulled up to a logic value of "1". Meanwhile, transistor 809 is switched off by the first input signal IN, and transistor 810 is switched on by the second input signal INBAR. In this way, pullup contention from transistor 101 is prevented, resulting in a fast transition speed of the first node N1 and the second node N2. Meanwhile, the switch 812 is switched on by the second inverted input signal INBAR_PD, and the switch 811 is switched off by the first inverted input signal IN_PD. In this way, the second node N2 is quickly pulled up to the desired logic value (i.e., logic value of "1").

When the first input signal IN is at a logic value of "0" and the second input signal INBAR is at a logic value of "1", the first write switch 805 is switched off and the second write switch 806 is switched on. As a result, the second node N2 is pulled down to a logic value of "0" and the first node N2 is pulled up to a logic value of "1". Meanwhile, transistor 809 is switched on by the first input signal IN, and transistor 810 is switched off by the second input signal INBAR. In this way, pullup contention from transistor 103 is prevented, resulting in a fast transition speed of the first node N1 and the second node N2. Meanwhile, the switch 812 is switched off by the second inverted input signal INBAR_PD, and the switch 811 is switched on by the first inverted input signal IN_PD. In this way, the first node N1 is quickly pulled up to the desired logic value (i.e., logic value of "1").

Figure 9:
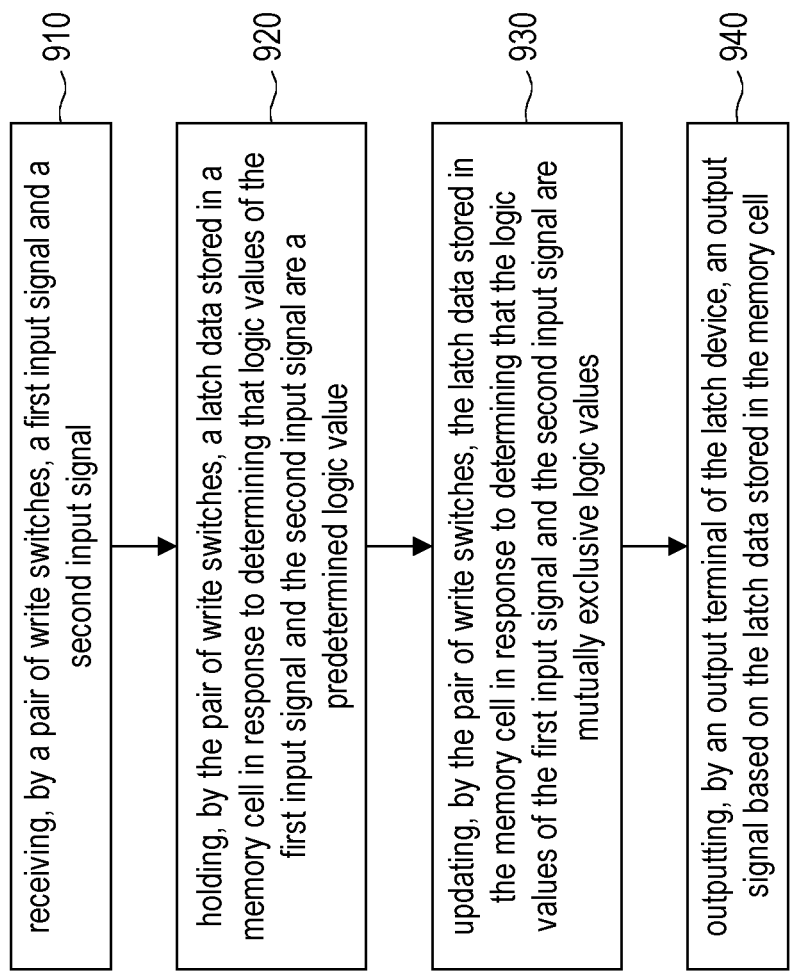
FIG. 9 illustrates a flowchart diagram of an operation method of a latch device in accordance with some embodiments.

FIG. 9 illustrates a flowchart diagram of an operation method of a latch device in accordance with some embodiments. In step 910, a first input signal and a second input signal are received. For example, the first input signal and a second input signal are received through a pair of write switches of the latch device. In step 920, a latch data stored in a memory cell of a latch device is held in response to determining that logic values of the first input signal and the second input signal are a predetermined logic value. The predetermined logic value may be "11" in some embodiment, and may be "00" in some alternative embodiments. In step 930, the data latch stored in the memory cell is updated in response to determining that the logic values of the first input signal and the second input signal are mutually exclusive logic values. For example, when the logic values of the first and second input signals are "10" or "01", the data latch stored in the memory cell is updated. In step 940, an output signal is outputted based on the latch data stored in the memory cell.

In the above embodiments, a latch device includes a pair of write switches that are configured to hold a latch data stored in a memory of the latch device or to update the latch data stored in the memory based on logic values of the first and second input signals. The latch device may hold the latch data stored in the memory when the logic values of the first and second input signals are a predetermined logic value; and the latch device may update the latch data stored in the memory when the logic values of the first and second input signals are mutually exclusive logic values. Since the pair of write switches may quickly pull up or pull down a first node and a second node coupled to the memory cell, the speed of the latch device is improved and the latency of the latch device is reduced. In addition, since the electronic components of the latch device are relatively small, the latch device has a small physical area in the integrated circuit. The latch device may further include a first and second switches that allows the latch device to set the latch data of the memory cell even when the logic values of both first and second input signals are the predetermined logic values. The latch device may further include first and second switches that receive a first and second inverted input signals for quickly pulling down the first node or the second node coupled to the memory cell to desired logic values. In this way, the speed of the latch device is further improved. Furthermore, the latch device may further include transistors that are configured to cut off the pulldown contention from transistors of the memory cell, thereby further improving speed of the latch device.

Although the embodiment of the disclosure has been described in detail, the disclosure is not limited to a specific embodiment and various modifications and changes are possible within the scope of the disclosure disclosed in the claims.

What is claimed is:

1. A latch device, comprising:
   a memory cell, comprising a pair of cross-coupled inverters, storing a latch data;
   a pair of write switches, coupled to the memory cell through a first node and a second node, receiving a first input signal and a second input signal, respectively, wherein the pair of write switches is configured to hold the latch data stored in the memory cell when the first input signal and the second input signal are in a predetermined logic value, and the pair of write switches is further configured to update the latch data stored in the memory cell when the first input signal and the second input signal are in mutually exclusive logic values; and
   an output terminal, coupled to at least one of the first node and the second node, outputting an output signal based on the latch data stored in the memory cell.

2. The latch device of claim 1, wherein
   a first cross-coupled inverter of the pair of cross-coupled inverters comprises a first transistor and a second transistor,
   a second cross-coupled inverter of the pair of cross-coupled inverters comprises a third transistor and a fourth transistor,
   control terminals of the first transistor and the second transistor are coupled to a second node,
   control terminals of the third transistor and the fourth transistor are coupled to the first node, and
   the output terminal of the latch device is coupled to at least one of the first node and the second node.

3. The latch device of claim 1, further comprising:
   a fifth transistor, coupled between the first node and a transistor of the pair of cross-coupled inverters, configured to electrically disconnect the first node from the transistor of the pair of cross-coupled inverters according to the first input signal; and
   a sixth transistor, coupled between the second node and another transistor of the pair of cross-coupled inverters, configured to electrically disconnect the second node from the other transistor of the pair of cross-coupled inverters according to the second input signal.

4. The latch device of claim 1, wherein the pair of write switches comprises:
a first write switch, coupled between a first reference node and the first node, receiving the first input signal and controlling an electrical connection between the first reference node and the first node according to the first input signal; and
a second write switch, coupled between the first reference node and the second node, receiving the second input signal and controlling an electrical connection between the first reference node and the second node according to the first input signal.

5. The latch device of claim 1, further comprising:
a first set switch, coupled between the first node and a second reference node, receiving a first control signal and controlling an electrical connection between the first node and the second reference node according to the first control signal; and
a second set switch, coupled between the second node and the second reference node, receiving a second control signal and controlling an electrical connection between the second node and the second reference node according to the second control signal,
wherein the first set switch and the second set switch are configured to set the latch data stored in the memory cell when the logic values of the first input signal and the second input signal are the predetermined logic value.

6. The latch device of claim 1, further comprising:
a pair of inverters, inverting the first input signal and the second input signal to generate a first inverted input signal and a second inverted input signal, respectively.

7. The latch device of claim 6, further comprising:
a first switch, coupled between a second reference node and the first node, configured to drive the first node to a second reference voltage when the second inverted input signal is asserted to the first switch;
a second switch, coupled between the second reference node and the second node, configured to drive the second node to the second reference voltage when the first inverted input signal is asserted to the second switch.

8. The latch device of claim 7, wherein
the second inverted input signal is asserted to the first switch when the second input signal is asserted to the second write switch, and
the first inverted input signal is asserted to the second switch when the first input signal is asserted to the first write switch.

9. A latch device, comprising:
a memory cell, comprising a pair of cross-coupled inverters, storing a latch data,
a pair of write switches, coupled to the memory cell through a first node and a second node, receiving a first input signal and a second input signal, respectively, wherein the pair of write switches is configured to hold the latch data stored in the memory cell when the first input signal and the second input signal are in a predetermined logic value, and the pair of write switches is further configured to update the latch data stored in the memory cell when the first input signal and the second input signal are in mutually exclusive logic values;
a pair of inverters, inverting the first input signal and the second input signal to generate a first inverted input signal and a second inverted input signal, respectively; and
a pair of switches, the pair of switches comprises:
a first switch, coupled to the first node, driving the first node to a reference voltage when the second inverted input signal is asserted to the first switch; and
a second switch, coupled to the second node, driving the second node to the reference voltage when the first inverted input signal is asserted to the second switch; and
an output terminal, coupled to at least one of the first node and the second node, outputting an output signal based on the latch data stored in the memory cell.

10. The latch device of claim 9, wherein
the second inverted input signal is asserted to the first switch when the second input signal is asserted to the second write switch, and
the first inverted input signal is asserted to the second switch when the first input signal is asserted to the first write switch.

11. The latch device of claim 9, wherein
a first cross-coupled inverter of the pair of cross-coupled inverters comprises a first transistor and a second transistor,
a second cross-coupled inverter of the pair of cross-coupled inverters comprises a third transistor and a fourth transistor,
control terminals of the first transistor and the second transistor are coupled to a second node,
control terminals of the third transistor and the fourth transistor are coupled to the first node, and
the output terminal of the latch device is coupled to at least one of the first node and the second node.

12. The latch device of claim 9, further comprising:
a fifth transistor, coupled between the first node and a transistor of the pair of cross-coupled inverters, configured to electrically disconnect the first node from the transistor of the pair of cross-coupled inverters according to the first input signal; and
a sixth transistor, coupled between the second node and another transistor of the pair of cross-coupled inverters, configured to electrically disconnect the second node from the other transistor of the pair of cross-coupled inverters according to the second input signal.

13. The latch device of claim 9, wherein the pair of write switches comprises:
a first write switch, coupled between a first reference node and the first node, receiving the first input signal and controlling an electrical connection between the first reference node and the first node according to the first input signal; and
a second write switch, coupled between the first reference node and the second node, receiving the second input signal and controlling an electrical connection between the first reference node and the second node according to the first input signal.

14. The latch device of claim 9, further comprising:
a first set switch, coupled between the first node and a second reference node, receiving a first control signal and controlling an electrical connection between the first node and the second reference node according to the first control signal; and
a second set switch, coupled between the second node and the second reference node, receiving a second control signal and controlling an electrical connection between the second node and the second reference node according to the second control signal,
wherein the first set switch and the second set switch are configured to set the latch data stored in the memory cell when the logic values of the first input signal and the second input signal are the predetermined logic value.

15. An operation method of a latch device that comprises a memory, a pair of write switches being coupled to the memory through a first node and a second node, the operation method comprising:
    receiving, by the pair of write switches, a first input signal and a second input signal;
    holding, by the pair of write switches, a latch data stored in the memory cell in response to determining that logic values of the first input signal and the second input signal are a predetermined logic value;
    updating, by the pair of write switches, the latch data stored in the memory cell in response to determining that the logic values of the first input signal and the second input signal are mutually exclusive logic values; and
    outputting, by an output terminal of the latch device, an output signal based on the latch data stored in the memory cell.

16. The operation method of claim 15, further comprising:
    inverting the first input signal and the second input signal to generate a first inverted input signal and a second inverted input signal, respectively;
    driving the first node to a reference voltage when the second inverted input signal is asserted to a first switch of the latch device;
    driving the second node to the reference voltage when the first inverted input signal is asserted to a second switch of the latch device.

17. The operation method of claim 15, wherein
    the second inverted input signal is asserted to the first switch when the second input signal is asserted to the second write switch, and
    the first inverted input signal is asserted to the second switch when the first input signal is asserted to the first write switch.

18. The operation method of claim 15, further comprising:
    coupling control terminals of a first transistor and a second transistor of a first cross-coupled inverter of the pair of cross-coupled inverters to a second node,
    coupling control terminals of a third transistor and a fourth transistor of a second cross-coupled inverter of the pair of cross-coupled inverters to the first node.

19. The operation method of claim 15, further comprising:
    electrically disconnecting the first node from a transistor of the pair of cross-coupled inverters according to the first input signal; and
    electrically disconnecting the second node from another transistor of the pair of cross-coupled inverters according to the second input signal.

20. The operation method of claim 19, wherein
    electrically disconnecting the first node from the transistor of the pair of cross-coupled inverters according to the first input signal comprises:
        switching off a fifth transistor that is coupled between the first node and the transistor of the pair of cross-coupled inverters according to the first input signal; and
    electrically disconnecting the second node from the other transistor of the pair of cross-coupled inverters according to the second input signal comprises:
        switching off a sixth transistor that is coupled between the second node and other transistor of the pair of cross-coupled inverters according to the first input signal.

* * * * *